United States Patent [19]

Hojabri

[11] Patent Number: 5,744,385

[45] Date of Patent: Apr. 28, 1998

[54] COMPENSATION TECHNIQUE FOR PARASITIC CAPACITANCE

[75] Inventor: Pirooz Hojabri, San Jose, Calif.

[73] Assignee: Plato Labs, Inc., San Jose, Calif.

[21] Appl. No.: 822,989

[22] Filed: Mar. 21, 1997

[51] Int. Cl.⁶ .................................................. H01L 27/02
[52] U.S. Cl. ........................ 438/238; 438/250; 438/251
[58] Field of Search ........................... 438/238, 381–384, 438/250–252, 393–395

[56] References Cited

U.S. PATENT DOCUMENTS

| | | | |
|---|---|---|---|
| 5,006,733 | 4/1991 | Brown | 307/521 |
| 5,021,681 | 6/1991 | Colbeck et al. | 307/261 |
| 5,063,309 | 11/1991 | Yamasaki | 307/521 |
| 5,173,835 | 12/1992 | Cornett et al. | 438/393 |
| 5,281,931 | 1/1994 | Bailey et al. | 333/17.1 |
| 5,356,826 | 10/1994 | Natsume | 438/384 |
| 5,500,387 | 3/1996 | Tung et al. | 438/384 |
| 5,530,399 | 6/1996 | Chambers et al. | 327/561 |

*Primary Examiner*—Jey Tsai
*Attorney, Agent, or Firm*—Townsend and Townsend and Crew LLP

[57] ABSTRACT

Various circuit techniques to implement continuous-time filters with improved performance are disclosed. The present invention uses RMC type integrators that exhibit lower harmonic distortion. In one embodiment, a novel high-gain two-pole operational amplifier is used along with RMC architecture to achieve lower harmonic distortion. In another embodiment, the present invention uses dummy polysilicon resistors to accurately compensate for the distributed parasitics of the polysilicon resistors used in RMC integrator. In yet another embodiment, the present invention provides an on-chip tuner with a differential architecture for better noise immunity.

6 Claims, 8 Drawing Sheets

COMPENSATION TECHNIQUE FOR PARASITIC CAPACITANCE

BACKGROUND OF THE INVENTION

The present invention relates in general to integrated circuits, and in particular to various circuit techniques for implementing continuous-time filters with improved performance.

The advent of cellular communication has introduced new design challenges. In, for example, code division multiple access (CDMA) cellular telephone applications, the low-pass filter that is required for filtering the baseband signal has a relatively wide bandwidth (e.g., 630 kHz). Conventional switched-capacitor (SC) techniques that are commonly used for an integrated circuit implementation of filters cannot be readily employed at such high frequencies. More specifically, the lower ratio between the sampling rate of the analog-to-digital converter (ADC) that normally receives the filter output, and the pass-band frequency of the filter, places severe design constraints on the smoothing filter that is necessary to remove the clock component from the output of the SC filter. Therefore, continuous-time circuit techniques need to be utilized to implement the filter instead of the switched-capacitor approach.

One type of continuous-time filter uses a combination of resistor R, metal-oxide-semiconductor field effect transistor (MOSFET) and capacitor C (thus the name RMC filter), along with an operational amplifier (opamp) to implement voltage-controlled integrators. An example of such an RMC filter is given in the article "Design of a low-distortion 22-kHz fifth-order Bessel filter, IEEE JSSC vol. SC-28, Dec. 1993 pp1254–1264" by U. K. Moon and B. S. Song.

Referring to FIG. 1, there is shown a conventional RMC integrator. Polysilicon resistors 108 connect to a source/drain terminal of current steering n-channel MOSFETs 110 and 112. The other source/drain terminal of MOSFETs 110 and 112 connect to the differential input terminals of opamp 116, respectively, along with integrating capacitors 114. In FIG. 1, $V_{CP}$ and $V_{CM}$ constitute the differential control voltages while $V_{MID}$ is mid-supply reference signal (GND). The unity-gain frequency of the RMC integrator of FIG. 1 can be adjusted by varying the differential voltage ($V_{CP}-V_{CM}$).

When such RMC integrators are used for synthesizing a signal flow-diagram of, for example, a ladder LC filter, MOSFETs 110 and 112 lie inside the local feedback loops. As a result, their non-linearity is attenuated by the loop-gain of the feedback loop. In this case, the non-linearity attenuation is mainly at low frequencies where due to the higher gain of the opamps the loop-gains are also high. For CDMA applications, however, where the filter's pass band edge is approximately 30 times higher than that for audio applications, lower opamp gain at frequencies close to the filter pass-band may introduce unacceptably high harmonics. Higher frequency applications therefore require opamps with very wide bandwidth. Opamps with very wide bandwidth implemented in CMOS technology, however, often dissipate larger amounts of current that increase the overall power consumption and lower the DC gain for the opamp.

A second limiting factor of the RMC integrator is bandwidth limitation due to distributed parasitics of polysilicon resistors. It is generally recognized that in order to minimize the harmonic distortion in the RMC integrator, polysilicon resistors are preferred over diffused (e.g., $p^+$) type resistors that have higher voltage coefficient. Polysilicon resistors, however, exhibit smaller sheet resistance. The smaller sheet resistance results in larger area for the polysilicon resistor and therefore larger parasitic capacitors. Such parasitic capacitors can significantly limit the overall filter bandwidth.

Another consideration in designing higher frequency continuous time filters is variations in filter frequency response caused by variations in fabrication process, temperature and power supply. To compensate for these variations, tuner circuits have been developed that are used along with the filter to tune its frequency response. FIG. 2 shows a conventional tuner circuit. The tuner circuit includes a sine-wave voltage-controlled oscillator (VCO) 100 whose outputs connect to inputs of a comparator 102. A phase detector 104 compares the phases between an external reference square-wave CLKA and the square-wave equivalent of the output of VCO 100, CLKB. Phase detector 104 generates at its output digital UP and DN pulses for a current output charge pump 106. Charge pump 106 provides the control voltage $V_c$ to VCO 100, through its R and C loop filter components.

VCO 100 is commonly implemented using integrators similar to those used in the main filter. Conventionally, the transconductance-capacitor ($g_m$-C) approach has been used to implement the integrators. The $g_m$-C approach has been adopted in high-frequency applications mainly because the transconductance elements are used open-loop. Because the transconductance elements are used open-loop, however, their harmonic distortion is high. Further more, since a large input voltage is applied to the inputs of these transconductance elements their implementation for 3 volt applications adds more complexity to the design of the integrator.

There is therefore a need for circuit techniques that address the above limitations and can implement continuous-time filters with improved performance.

SUMMARY OF THE INVENTION

The present invention provides various circuit techniques to implement continuous-time filters with improved performance. Broadly, the present invention uses RMC type integrators that exhibit lower harmonic distortion. In one embodiment, a novel high-gain two-pole operational amplifier is used along with RMC architecture to achieve lower harmonic distortion. In another embodiment, the present invention uses dummy polysilicon resistors to compensate for the distributed parasitics of the polysilicon resistors used in RMC integrator to drastically reduce bandwidth limitations caused by parasitic capacitors. In yet another embodiment, the present invention provides an on-chip tuner with a differential architecture for better noise immunity. The tuner according to the invention provides a low-impedance control-voltage as opposed to commonly used high-impedance circuits. The frequency response of the filter is thus made process, temperature and supply insensitive by the tuner.

Accordingly, in one embodiment, the present invention provides an amplifier circuit including a first operational amplifier (opamp) having a differential pair of input terminals receiving a differential input signal, and a differential pair of output terminals; a second operational amplifier (opamp) having a differential pair of input terminals coupled to the differential pair of output terminals of the first opamp, and a differential pair of output terminals; and a feedforward circuit having a differential pair of input terminals coupled to the differential pair of input terminals of the first opamp, and a differential pair of output terminals coupled to the second opamp. The differential input signal bypasses the first opamp through the feed-forward circuit at a selected frequency. Each opamp is a two-stage cascode differential opamp with a single dominant pole.

In another embodiment, the present invention provides in an RMC integrator having a resistor and a capacitor coupled to an operational amplifier, a method for implementing a compensation capacitor coupled across the resistor to compensate for parasitic capacitance of the resistor. The method includes the steps of: implementing the resistor by forming a first layer of polysilicon material in a snake like fashion with a plurality of fingers, forming on top of a first conductive material a dielectric layer having a shape identical to that of the resistor but with fewer fingers, forming a second layer of polysilicon material over the dielectric material, coupling a first end and a second end of the second layer of polysilicon material to a first end of the resistor, and coupling the first conductive material to a second end of the resistor. The method further includes the step of placing the first layer of polysilicon material on top of a first well inside a substrate, wherein the first conductive material is a second well inside the substrate. In a specific embodiment, a size of the second layer of polysilicon material is 1/6 of that of the first polysilicon material.

In yet another embodiment, the present invention provides a tuner circuit for use with continuous-time RMC filters, the tuner circuit includes a voltage-controlled oscillator a differential pair of output terminals, a comparator having a differential pair of input terminals coupled to the differential pair of output terminals of the voltage-controlled oscillator, a phase detector having a first input terminal coupled to an output of the comparator and a second input terminal coupled to an external clock signal, and a differential charge pump circuit receiving first and second control signals from the phase detector, and supplying a differential pair of voltage signals to the voltage-controlled oscillator. The charge pump circuit includes an operational amplifier having a differential pair of input terminals and a differential pair of output terminals, a first pair of current source devices coupled to a first terminal of the differential pair of input terminals of the operational amplifier, and a second pair of current source devices coupled to a second terminal of the differential pair of input terminals of the operational amplifier, wherein the first and second pair of current source devices are controlled by the first and second control signals from the charge pump circuit.

A better understanding of the nature and advantages of the present invention may be had with reference to the detailed description below and the accompanying drawings.

DESCRIPTION OF THE PREFERRED EMBODIMENT

As discussed above, in order to extend the RMC continuous-time filter techniques to high frequency applications such as CDMA cellular telephones, one must overcome bandwidth limitations of the RMC integrator. Limited gain-bandwidth product of conventional CMOS operational amplifiers is one factor contributing to the integrator bandwidth limitations.

Wide-bandwidth Operational Amplifier

Figure 3:
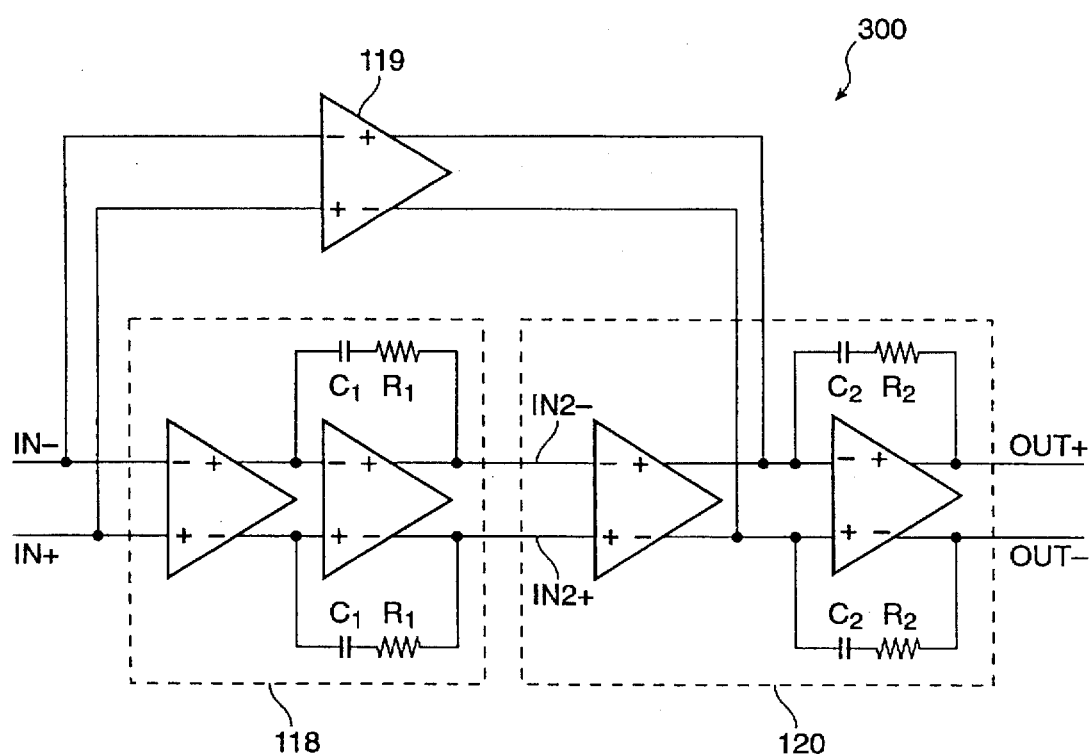
FIG. 3 illustrates the architecture of a two-pole operational amplifier for use in RMC integrators according to one embodiment of the present invention.

The present invention addresses this problem by providing a novel implementation of a wide-bandwidth operational amplifier (opamp) for use in RMC integrators. Referring to FIG. 3, there is shown the architecture of a two-(dominant) pole opamp 300. Opamp 300 is realized by cascading two one-(dominant)pole, two-stage sub-opamps 118 and 120. Sub-opamps 118 and 120 are fully differential and each include a differential pair of input terminals and a differential pair of output terminals. The input terminals of sub-opamp 118 connect to the inputs of main opamp 300, and its output terminals drive a first pair of inputs of sub-opamp 120. The output terminals of sub-opamp 120 connect to the outputs of the main opamp 300. A feed-forward stage 119 bypasses sub-opamp 118 by connecting the input terminals of main opamp 300 to sub-opamp 120 as shown.

The frequency response of opamp 300 is stabilized by generating left-half-plane zeros, some of which are close to the unity-gain frequency of the opamp. These left-half-plane zeros are synthesized by proper choices for the values of $R_1$, $C_1, R_2, C_2$, and the feed-forward mechanism provided by stage 119. Feed-forward stage 119 is a transconductance element whose output current is summed with the output current of the first stage of sub-opamp 120. Using this approach, close to the unity gain frequency of opamp 300, the signal bypasses the first sub-opamp 118 altogether and is fed to the second sub-opamp 120. As a result, opamp 300 exhibits very high DC gain, equivalent to that of two opamps, while at high frequencies the overall opamp behaves like a single opamp. With an exemplary 40 dB/dec roll-off of the gain magnitude of opamp 300, large open-loop gain of, for example, 160 dB can be realized with moderate bandwidth of, for example, 25 MegHz.

Figure 4:
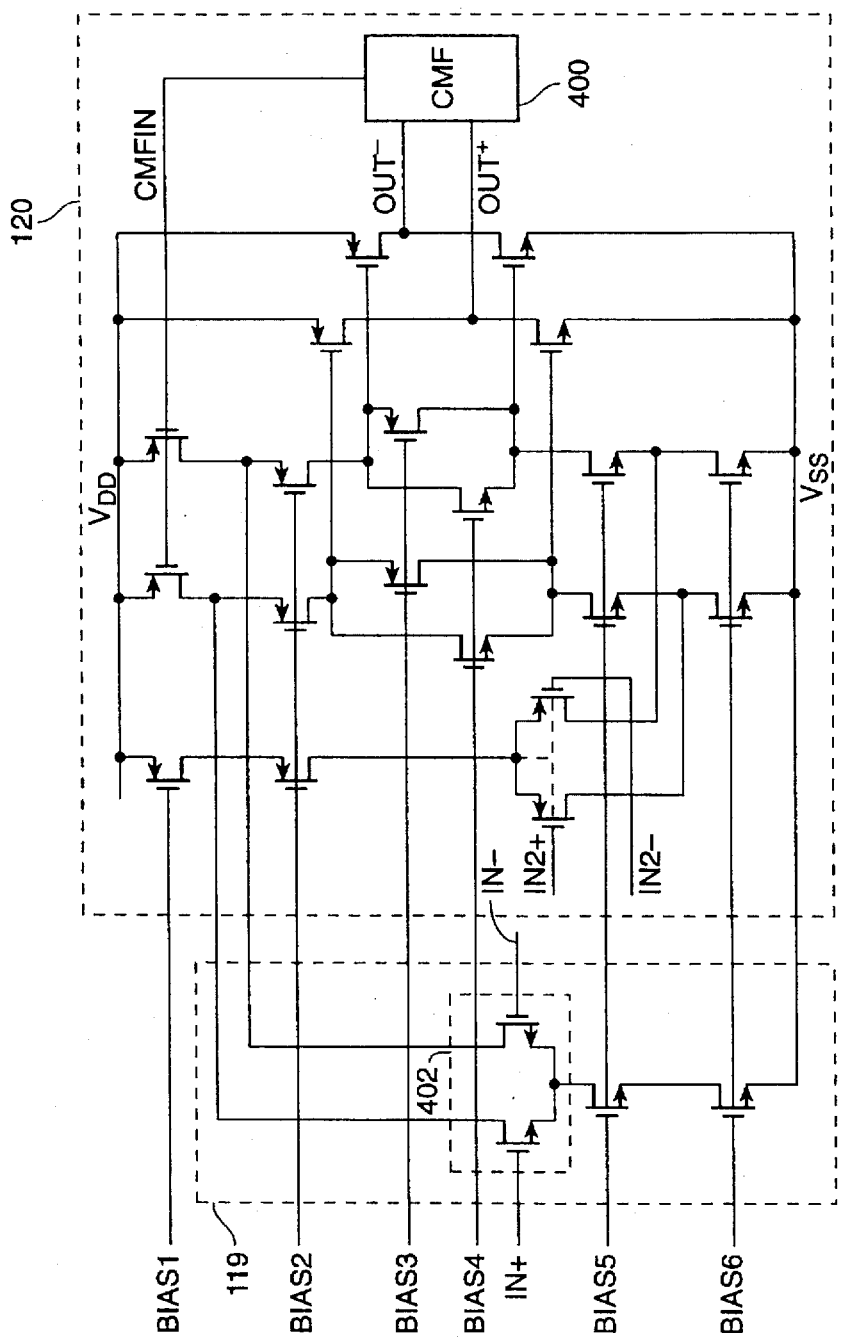
FIG. 4 is simplified circuit schematic for an exemplary embodiment of a sub-opamp for use in the operational amplifier of FIG. 3.

FIG. 4 shows a simplified circuit schematic for an exemplary embodiment for sub-opamp 120 and feed-forward circuit 119. In this example, sub-opamp 120 is implemented using a two-stage folded cascode operational amplifier with p-channel input differential pair, and a class A/B second gain stage. A similar circuit is used to implement sub-opamp 118. For each sub-opamp, a common-mode feedback (CMF) circuit 400 sums the two outputs and, after some amplification, applies the resulting signal to the common-mode feedback input CMFIN of each subopamp as shown. The bias circuit that supplies bias signals BIAS1 to BIAS6 to the cascode current source transistors in the operational amplifier is not shown to simplify depiction of the circuit.

FIG. 4 also shows a preferred implementation of feed-forward circuit 119. In this embodiment, feed-forward transconductance element 119 is realized using an n-channel differential pair 402. The gate terminals of n-channel differential pair 402 connect to the input terminals IN+ and IN− of main opamp 300. The input terminals IN2+ and IN2− of the second sub-opamp 120 connect to the output terminals OUT1+ and OUT1− of first sub-opamp 118, respectively. The output of n-channel differential pair 402 are summed with the output current of the first (input differential) stage of second sub-opamp 120.

Parasitic Capacitor Cancellation

Figure 5:
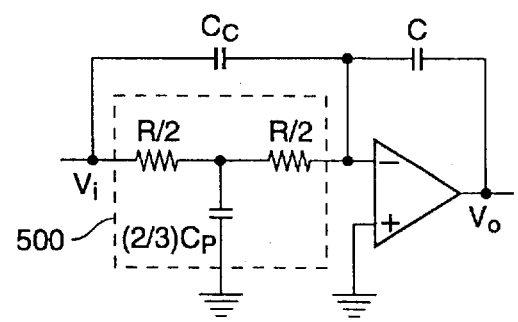
FIG. 5 shows a simplified single-ended integrator illustrating the compensation technique for parasitic capacitance of the polysilicon resistor in an RMC integrator.

Another factor contributing to filter bandwidth limitation is the parasitic capacitance introduced by low sheet resistance polysilicon resistors used in the RMC integrators. The present invention provides a compensation scheme to cancel the effects of the parasitic capacitance of the polysilicon resistor with a high-degree of accuracy. FIG. 5 shows a simplified schematic of a single-ended integrator illustrating the use of a compensation capacitor to cancel parasitic capacitance. Considering the distributed nature of parasitics of a resistor and using two-port admittance parameters for a uniform RC transmission line, the integrator resistor can be modeled by its π network 500. As shown in FIG. 5, π network 500 includes two resistive side components that are equal to R/2, and a middle component is a capacitor equal to $\frac{2}{3}$ of the total parasitic capacitance $C_p$. The parasitic effects of the resistor are nominally cancelled by including a compensation capacitor $C_C$ having a value equal to $\frac{1}{6}$ of $C_P$. With $C_C$ connected across the integrator resistor, assuming an ideal opamp, the integrator behaves like an ideal integrator.

Figure 6:
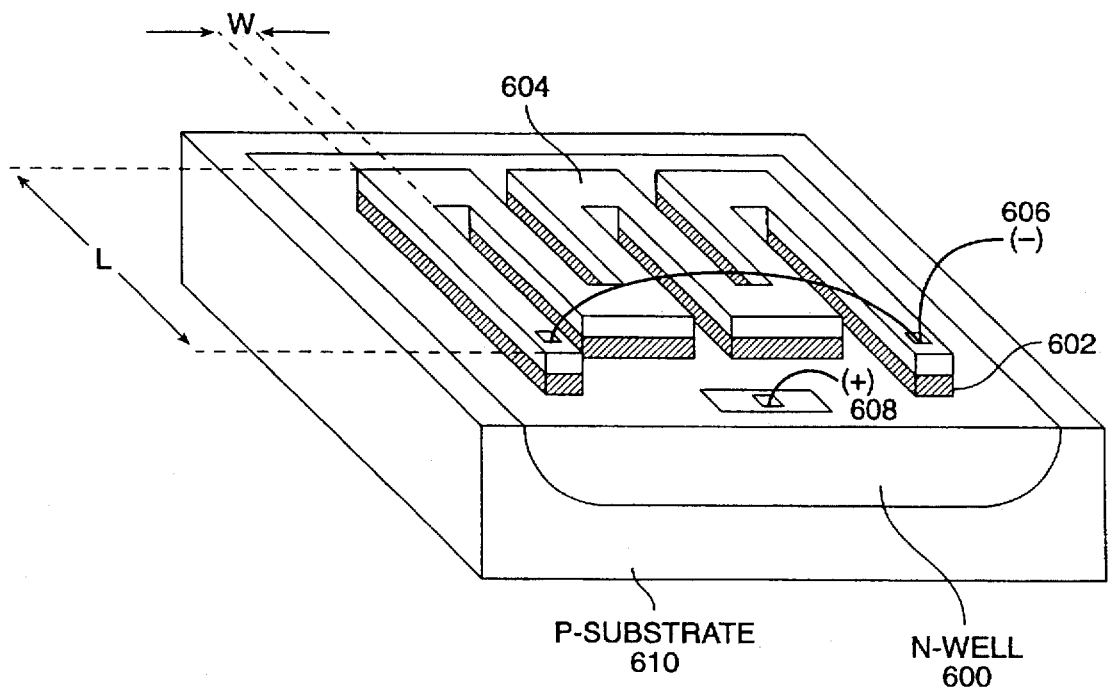
FIG. 6 shows the layout of the compensation capacitor for the RMC integrator according to the present invention.

How well the parasitics are cancelled depends to a large degree on how accurately the relationship $C_C=\frac{1}{6}C_P$ is realized. This requires an accurate estimation of the value of $C_P$ and an accurate lay out of capacitor $C_C$. The present invention provides a novel method of implementing the compensation capacitor $C_C$ to maximize the accuracy in cancelling the parasitic capacitance due to the polysilicon resistors in the RMC integrator. Referring to FIG. 6, there is shown a schematic representation of how compensation capacitor $C_C$ is implemented according to the present invention. A polysilicon dummy resistor $R_D$ with a value equal to one sixth of the value of the main resistor to be compensated is utilized to replicate the parasitic conditions of the main resistor. Dummy resistor $R_D$ is formed of polysilicon layer 604 and is laid on top of a dielectric layer 602 such as silicon dioxide. Polysilicon layer 604 is drawn using the identical finger size (length $l$, width $w$) as the main resistor. Dummy resistor $R_D$ is drawn in a dedicated well, shown in the exemplary embodiment of FIG. 6 as n-type well 600 inside a p-type substrate 610. The separate n-wells for the main and the dummy resistors minimize any noise coupling from the substrate. The two ends of the dummy resistor are electrically shorted together and form one electrode 606 of the compensation capacitor $C_C$, while an n+ contact 608 to n-well 600 forms the other electrode of the compensation capacitor.

Figure 1:
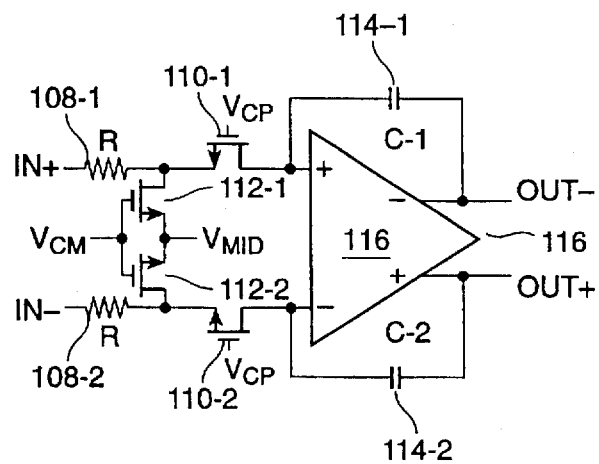
FIG. 1 is a circuit schematic of a conventional RMC integrator for use in continuous-time filters.

Since the layout of the dummy resistor $R_D$, and thus the compensation capacitor $C_C$, replicates the layout of the integrator main resistor, the parasitic conditions are also replicated. As a result, the total capacitance value of $C_C$ very accurately matches $\frac{1}{6}$ of the parasitic capacitance $C_P$ of the resistor (108 in FIG. 1) in the RMC integrator. By thus improving the cancellation of the parasitics, any bandwidth limitations caused by parasitic capacitances is minimized.

Low Impedance Tuner

Figure 7A:
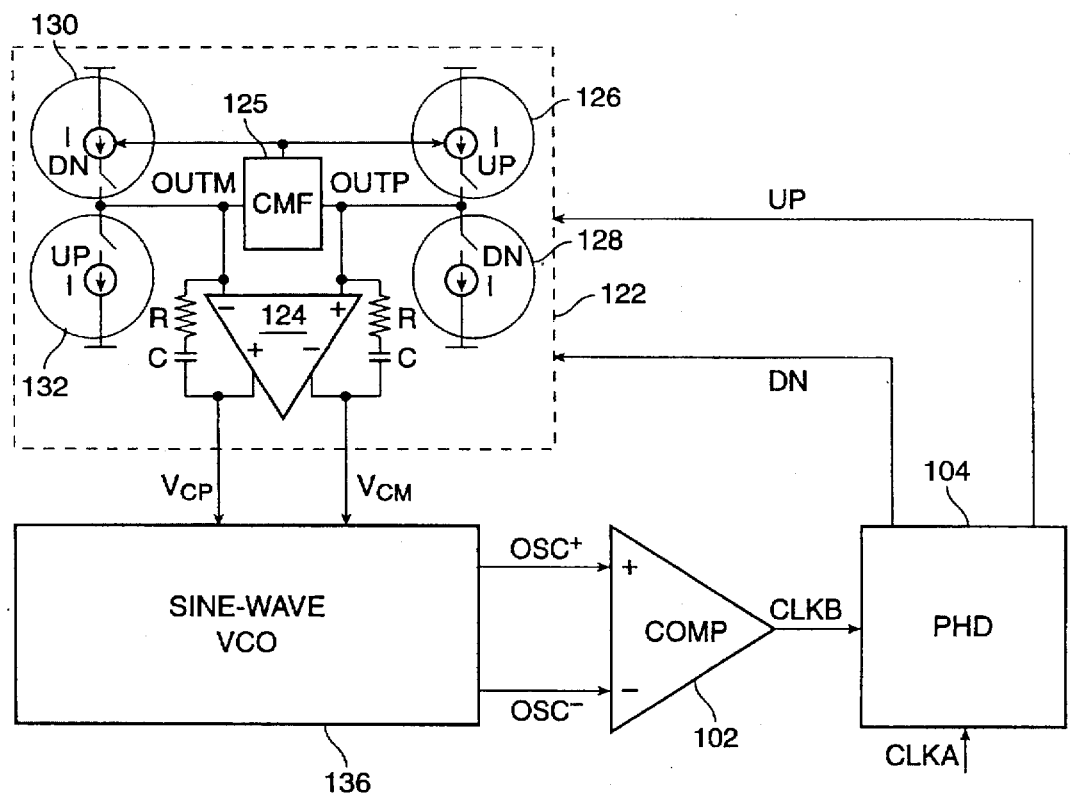
FIG. 7A is a block diagram of a low-impedance tuner circuit according to one embodiment of the present invention.

In another embodiment, the present invention provides an improved tuner circuit for tuning out any variations in the time constant of the RMC integrator caused by variations in any of its components. The tuner circuit of the present invention is based on a phase-locked loop (PLL) design and is fully differential to supply differential control signals to the RMC integrator. FIG. 7A shows the tuner circuit according to one embodiment of the present invention which provides several significant improvements over the tuner circuit of FIG. 1.

Figure 2:
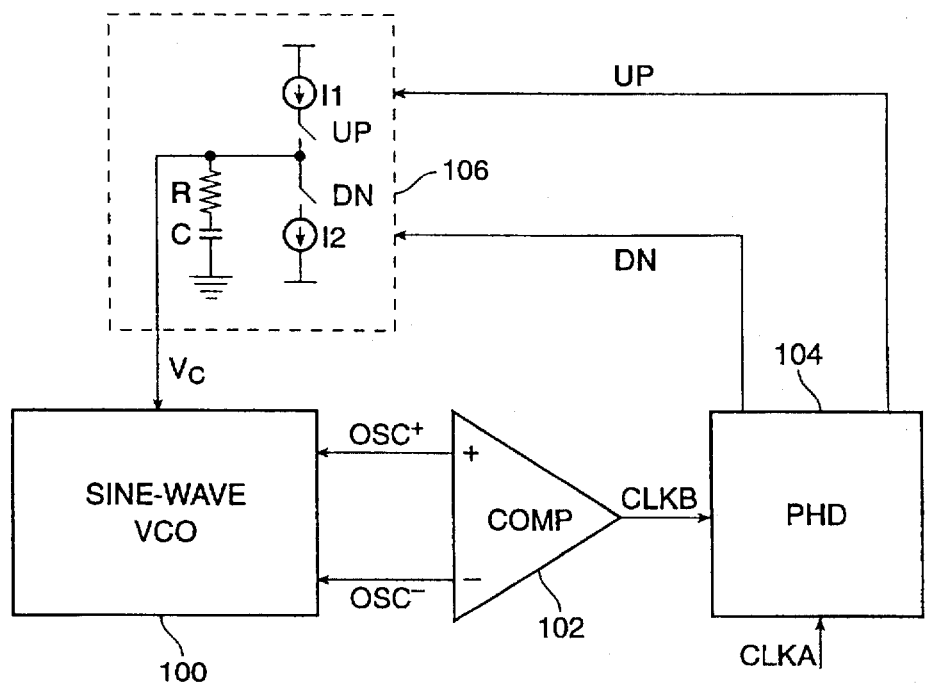
FIG. 2 shows a conventional tuner circuit used along with RMC filters for frequency compensation.

The tuner circuit according to the embodiment of the present invention shown in FIG. 7A includes a low-impedance differential charge-pump 122 instead of the high-impedance single-ended charge-pump of the conventional tuner circuit (106 in FIG. 2). Differential charge pump 122 includes a differential opamp 124 whose differential outputs supply the differential control signals $V_{CP}$ and $V_{CM}$. A differential current source circuit connects to the inputs of differential opamp 124. A first pair of switched current sources 126 and 128 couple to one input of opamp 124, and a second pair of switched current sources 130 and 132 connect to the other input of opamp 124. The outputs of phase detector 104, Up and DN, control the state of current source switches. In addition to the common-mode feedback circuit that is internal to differential opamp 124, the differential current source section includes a separate common-mode feedback that is implemented using the block CMF 125 as shown.

In operation, charge pump circuit 122 receives the control signals UP and DN which switch the differential current. After being integrated on the feedback capacitors C, the signal generates positive or negative change in the differential control voltage $V_{CP}$-$V_{CM}$. With this implementation, even if some mismatch exists between sinking current source (126) and sourcing current sources (128), the output common-mode voltage of the charge pump circuit is independently determined by the opamp, while the differential voltage $V_{CP}$-$V_{CM}$ is controlled by the difference between the sinking and sourcing current sources. The charge pump circuit as thus implemented generates a voltage as opposed to current output signal and exhibits low-impedance at its output. Thus, the control voltages $V_{CP}$ and $V_{CM}$ are much less susceptible to noise.

The use of opamp 124 according to the present invention also helps reduce jitter in VCO output waveform. With this implementation, current sources have more linear operation since their output voltage is fixed at the level of the common-mode voltage appearing at the input of opamp 124. The amount of current in each current source, thus does not change with the level of the output voltage. This reduction in current source nonlinearity causes the VCO input voltage variation and hence VCO jitter to be reduced significantly.

Figure 7B:
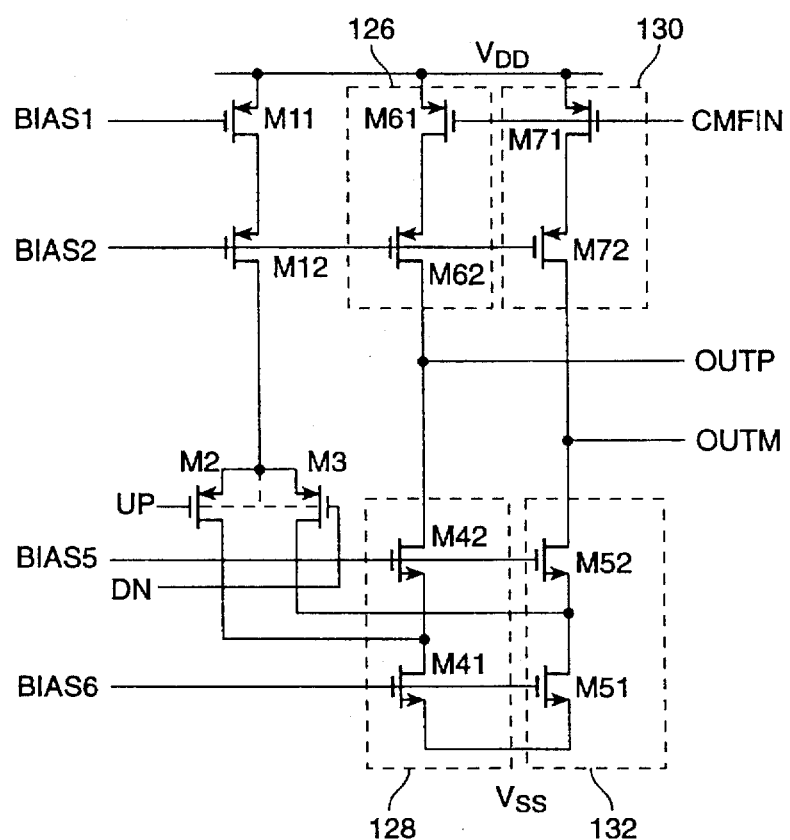
FIG. 7B shows an exemplary implementation of a differential switched current source circuit for use in the charge pump circuit of the tuner of FIG. 7A.

An exemplary implementation for the differential current source structure of charge pump 122 is shown in FIG. 7B. The circuit is made up of a differential folded cascode circuit that receives control signals UP and DN at gate terminals of a differential pair of MOS transistors M2 and M3, respectively. Cascode transistors M61/M62 implement switched current source 126, transistors M71/M72 implement switched current source 130, transistors M41/M42 implement current source 128, and transistors M51/M52 implement switched current source 132. The outputs OUTP and OUTM connect to the positive and negative inputs of opamp 124 and CMF block 125. The common mode feedback signal CMFIN is applied to gate terminals of transistors M61 and M71 as shown. For purposes of this description, assuming that the current in current source devices M11, M41 and M51 are equal and twice as that of current source devices M61 and M71. When signal UP is logic high and DN is logic low, transistor M2 turns OFF while M3 is ON. As a result, the full current of M11 flows through M41 turning M42 OFF. Consequently, the sourcing current of current source transistor M61 flows out through its cascode device M62 and through OUTP terminal while the sinking current of transistor M51 flows in through its cascode device M52 and OUTM output terminal. For the case where UP input is logic low and DN input is logic high, the current of current source devices M11 fully flows through device M51 turning cascode transistor M52 OFF. As a result the current at output terminal OUTP flows in through cascode transistor M42 and sinking current source transistor M41, while that of terminal OUTM flows out through sourcing current source M71 and its corresponding cascode device M72. This current sourcing and sinking action is integrated on feedback capacitors of opamp 124 (FIG. 7A) generating control voltages $V_{CP}$ and $V_{CM}$ for tuning circuit 136. For the case where UP and DN inputs are both logic high no current is flowing in or out of terminals OUTP and OUTM.

Figure 8:
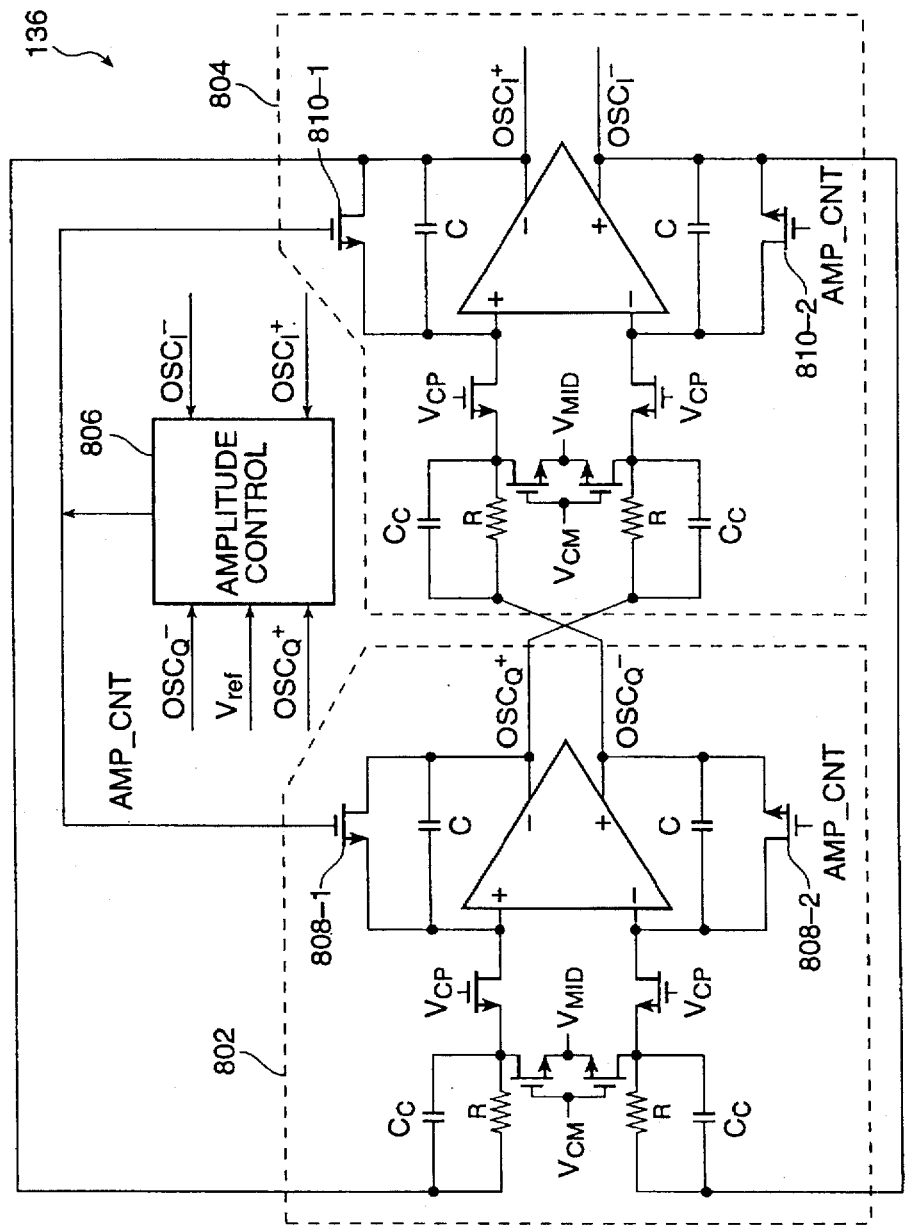
FIG. 8 is a simplified schematic showing an exemplary implementation of a voltage-controlled oscillator using RMC integrators according to the present invention.

The voltage-controlled oscillator VCO 136 of this tuner circuit is implemented using the high bandwidth integrators of the present invention. FIG. 8 shows an exemplary implementation of VCO 136 wherein a quadrature sine-wave oscillator 800 is synthesized using two RMC integrators 802 and 804. Each integrator is preferably implemented using the wide bandwidth opamp of the present invention an embodiment of which is shown in FIGS. 3 and 4. Note that the differential outputs of integrator 802 connect to the differential inputs of integrator 804 in a cross-coupled fashion, while there is a direct one-to-one coupling between the differential outputs of integrator 804 and the differential inputs of integrator 802. Parasitic capacitance of integrator resistors R are cancelled by the use of compensation capacitors $C_c$ that are preferably implemented using the technique of the present invention as shown in FIG. 6. The circuit of FIG. 8 conceptually shows how compensation capacitors $C_C$ are connected.

According to this embodiment of the present invention, amplitude control of the sine-wave oscillator 800 is achieved by comparing the sum of the squares of the two quadrature outputs of the oscillator (i.e., $A^2\cos\omega t^2 + A^2\sin\omega t^2 = A^2$) with a square of a reference voltage (Vref$^2$). The output AMP—CNT of amplitude control block 806 drives the gate terminals of MOS amplitude control devices 808 and 810 in integrators 802 and 804, respectively.

Figure 9:
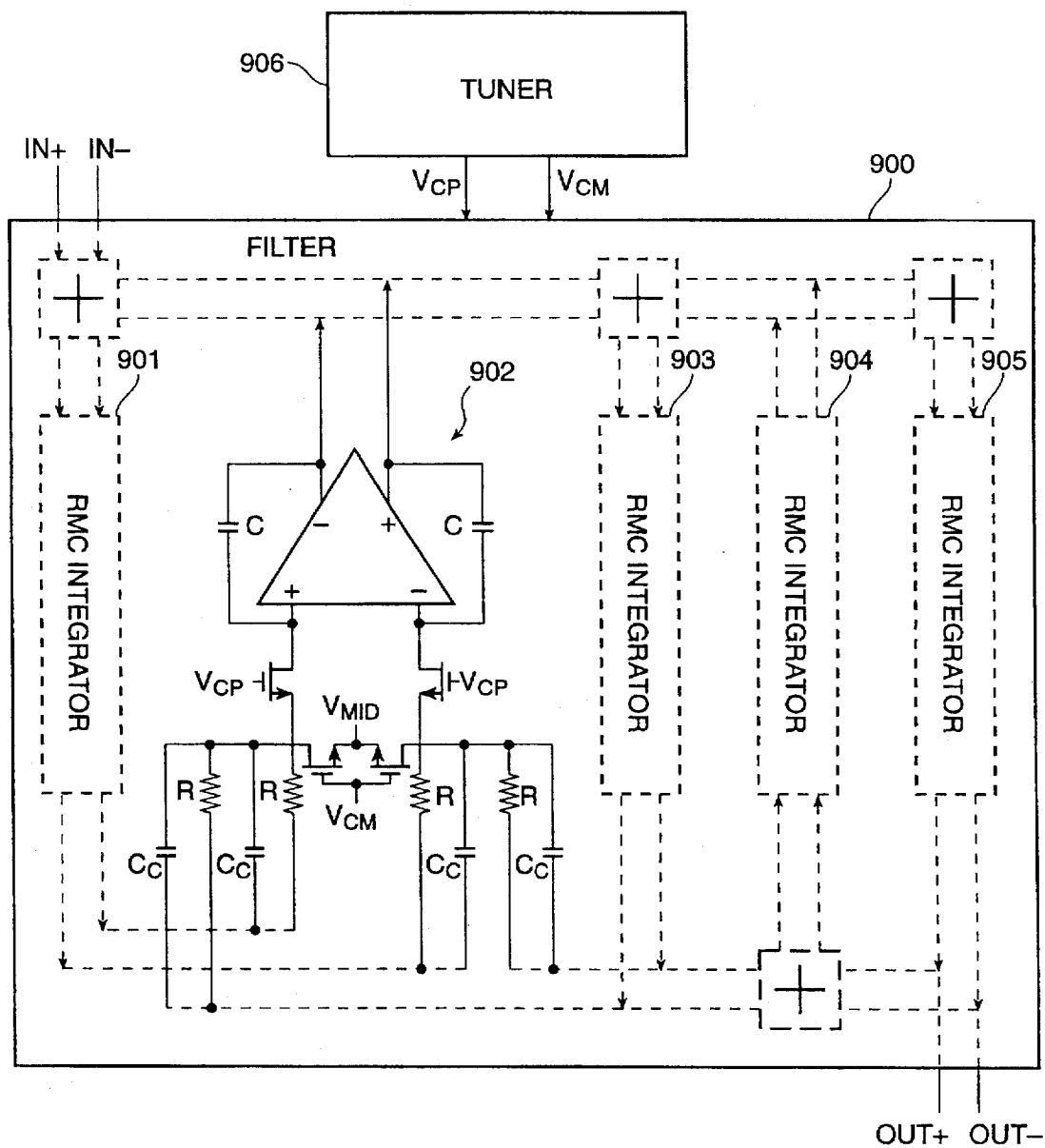
FIG. 9 shows one example of an RMC continuous-time filter implemented using the techniques of the present invention.

FIG. 9 illustrates how the various circuit techniques of the present invention can be advantageously employed to implement an exemplary RMC filter 900. Filter 900 is an equivalent of an LC ladder filter that is synthesized by several RMC integrators according to the present invention. The exemplary RMC filter shown in FIG. 9 includes five RMC integrators 901, 902, 903, 904, and 905 that are connected back to back as shown. Except for the first and last integrators 901 and 905, the remaining integrators are each driven by two adjacent integrators. In addition to the integrating function, each integrator in this configuration performs the function of summing its two input signals. The implementation of this summing function is shown in the case of integrator 902. The source and load termination resistors of the LC ladder filter are modeled by the first and last integrators 901 and 905 by adding feedback resistors in addition to the feedback capacitors. A tuner circuit 906 tunes filter 900 by means of differential control voltages $V_{CP}$ and $V_{CM}$.

By using the wide-bandwidth operational amplifier, the RMC integrators, and the tuner circuit of the present invention, filter 900 can achieve a frequency accuracy of, for example, ±2% over variations in fabrication process and temperature. Filter 900 exhibits a pass-band edge frequency of, for example, approximately 630 kHz, and pass-band ripple of, for example, ±1.1 dB while the stop-band loss is about 50 dB.

In conclusion, the present invention provides various circuit techniques to implement continuous-time filters with improved performance. According to the invention, RMC integrators use wide bandwidth high-gain differential opamps and accurate compensation capacitors to minimize bandwidth limiting factors and to achieve lower harmonic distortion. An on-chip tuner with a differential charge pump circuit provides a low-impedance control-voltage. While the above provides a complete description of several specific embodiments of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. In a semiconductor device, a method for realizing a compensation capacitor replicating parasitic capacitance of a polysilicon resistor comprising the steps of:

forming a well region having impurities of a first conductivity type inside a substrate having impurities of a second conductivity type;

forming a layer of dielectric material on top of said well region, said dielectric material having a shape identical to a shape of the polysilicon resistor;

forming a layer of polysilicon material on top of said layer of dielectric material;

forming a contact at a first end of said layer of polysilicon material and a contact at a second end of said layer of polysilicon material;

electrically shorting said first contact to said second contact to form a top plate of the compensation capacitor; and forming a contact in said well region to from a bottom plate of the compensation capacitor.

2. The method of claim 1 wherein a size of said layer of polysilicon material is a predetermined fraction of a size of the polysilicon resistor whereby a capacitance of said compensation capacitor is a predetermined fraction of the parasitic capacitance of the polysilicon resistor.

3. The method of claim 2 wherein said dielectric material comprises silicon dioxide.

4. The method of claim 2 wherein said polysilicon resistor couples to an input of an operational amplifier in an integrator, and wherein the compensation capacitor is coupled in parallel to said polysilicon resistor.

5. In an integrator having a polysilicon resistor coupled to an input of an operational amplifier, a method for cancelling parasitic capacitance of the polysilicon resistor comprising the steps of:

forming a well region having impurities of a first conductivity type inside a substrate having impurities of a second conductivity type;

forming a layer of dielectric material on top of said well region, said dielectric material having a shape substantially identical to a shape of the polysilicon resistor;

forming a layer of polysilicon material on top of said layer of dielectric material;

forming a contact at a first end of said layer of polysilicon material and a contact at a second end of said layer of polysilicon material;

electrically shorting said first contact to said second contact to form a top plate of a compensation capacitor;

forming a contact in said well region to from a bottom plate of said compensation capacitor; and coupling said compensation capacitor across said polysilicon resistor.

6. The method of claim 5 wherein a size of said layer of polysilicon material is a predetermined fraction of a size of the polysilicon resistor whereby a capacitance of said compensation capacitor is a predetermined fraction of the parasitic capacitance of the polysilicon resistor.

* * * * *